United States Patent
Chen

(10) Patent No.: US 6,864,523 B2
(45) Date of Patent: Mar. 8, 2005

(54) SELF-ALIGNED SOURCE POCKET FOR FLASH MEMORY CELLS

(75) Inventor: Chun Chen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/457,471

(22) Filed: Jun. 10, 2003

(65) Prior Publication Data

US 2003/0205747 A1 Nov. 6, 2003

Related U.S. Application Data

(62) Division of application No. 10/211,257, filed on Aug. 5, 2002, which is a division of application No. 09/773,523, filed on Feb. 2, 2001.

(51) Int. Cl.⁷ .................. H01L 27/108; H01L 29/76; H01L 29/94
(52) U.S. Cl. .................. 257/296; 257/314; 257/315; 257/316; 257/317; 257/320; 257/321; 257/390; 257/391
(58) Field of Search .................. 257/296, 314, 257/315, 316, 317, 320, 321, 390, 336, 344, 408, 412, 391; 438/439, 257, 264, 286, 302

(56) References Cited

U.S. PATENT DOCUMENTS

| | | | | |
|---|---|---|---|---|
| 4,957,877 A | * | 9/1990 | Tam et al. | 438/264 |
| 5,482,881 A | | 1/1996 | Chen et al. | |
| 5,631,179 A | * | 5/1997 | Sung et al. | 438/264 |
| 5,744,834 A | | 4/1998 | Lee | |
| 5,891,774 A | * | 4/1999 | Ueda et al. | 438/264 |
| 5,920,776 A | * | 7/1999 | Fratin et al. | 438/257 |
| 5,990,509 A | | 11/1999 | Burns, Jr. et al. | |
| 6,127,235 A | | 10/2000 | Gardner et al. | |
| 6,268,248 B1 | * | 7/2001 | Mehrad | 438/262 |
| 6,274,901 B1 | * | 8/2001 | Odake et al. | 257/315 |
| 6,495,885 B1 | | 12/2002 | Ahmad et al. | |

* cited by examiner

*Primary Examiner*—Minhloan Tran
*Assistant Examiner*—Tan Tran
(74) *Attorney, Agent, or Firm*—Dickstein Shapiro Morin & Oshinsky LLP

(57) ABSTRACT

An improved method for forming a flash memory is disclosed. A self-aligned source implanted pocket located underneath and around the source line junction is formed after the field oxide between adjacent word lines is removed, and before or after the self-aligned source doping is carried out, so that the configuration of the implanted boron follows the source junction profile.

17 Claims, 10 Drawing Sheets

SELF-ALIGNED SOURCE POCKET FOR FLASH MEMORY CELLS

This application is a divisional of application Ser. No. 10/211,257 filed on Aug. 5, 2002, which in turn is a divisional of Serial No. 09/773,523, filed on Feb. 2, 2001, the disclosures of which are incorporated by reference herein.

FIELD OF THE INVENTION

The present invention relates generally to semiconductor circuits and, in particular, to a method of forming self-aligned source pockets in flash memory cells.

BACKGROUND OF THE INVENTION

During the fabrication of metal-oxide-semiconductors (MOS), a silicon substrate is typically divided into a plurality of active and isolation regions by an isolation process. A thin gate oxide is subsequently grown on an upper surface of the substrate and over the active regions. A plurality of gates are then formed over the gate oxide layer, so that each gate bridges the substrate between areas to be doped as source/drain regions. The source/drain regions are consequently implanted with an impurity concentration sufficient to render them conductive.

MOS technology is greatly employed in the fabrication of nonvolatile memory cells. Non-volatile memory cells are known in the art as either read-only memory (ROM) or programmable-read-only memory (PROM). One type of MOS PROM is the flash memory EEPROM (Electrically Erasable Programmable ROM).

Non-volatile MOS PROMs can be fabricated using well-known technologies such as floating gate tunnel oxide, textured polysilicon, or EEPROM-tunnel oxide, among others. The programming and erasing of the corresponding EEPROM cell differ depending upon the type of technology employed. For example, a floating gate tunnel oxide EEPROM transistor is programmed (electrons are moved into the floating gate) by biasing the control gate and drain, and erased (electrons are moved out of the floating gate) by biasing the control gate and source of the flash cell.

An example of a conventional stacked-gate flash memory cell is illustrated in FIG. 1, where on a semiconductor substrate 10, source and drain regions 12 and 14, respectively, are displaced on either side of a gate structure 30. Field oxide regions (not shown in FIG. 1) are formed by isolation techniques such as STI or LOCOS processes, and provide electrical and physical separation between neighboring source/drain active regions. A tunnel oxide 24, a floating gate 25, an inter poly dielectric (IPD) 26, and a control gate 27 form a gate structure 30 on the semiconductor substrate 10.

The operation of flash memory depends primarily on the type of techniques used to inject and/or remove charge from the floating gate 25. In general, the operation of flash memory involves (1) programming the array of memory cells, which requires a cell-by-cell control of the amount of charge stored in the floating gate; and (2) erasing the entire array, or only portions of the array, to a predetermined charge state in the floating gate. For example, some flash memories use Fowler-Nordheim tunneling both for programming as well as for erasing the memory cell array. Other flash memories, however, use hot electron injection for programming and Fowler-Nordheim tunneling for erasing.

One problem of the Fowler-Nordheim tunneling erase is the source-side depletion that occurs during a source-side Fowler-Nordheim tunneling erase operation. As known in the art, in a flash memory formed in a p-type semiconductor substrate 10 having n-type source and drain regions 12, 24, a source-side Fowler-Nordheim tunneling erase operation is obtained by applying a potential of approximately 12 volts to the source region 12, grounding the substrate 10 and setting the word line, which is connected to the control gate 27, to be at zero volts. Another bias condition is to bias the source region 12 at 6 volts and bias the control gate 27 at −10 volts. This way, an erase operation is achieved between the source region 12 and the floating gate 25, while an unwanted large voltage difference, of 12 volts or 6 volts, depending on the bias condition, is also created between the source region 12 and the substrate 10. This voltage difference further induces an undesirable substrate current as well as a hot hole current. Another problem during the erase operation is the occurrence of gate-induced diode leakage (GIDL), which also contributes to the substrate current. The substrate current can induce change in the substrate bias from about 0 volts to about 1 volts, or higher.

Attempts have been made at suppressing the unwanted current by employing a so-called double diffusion source process, which creates a gradual or two-stage change in the concentration of n-type doping between the source region 12 and the substrate 10. While this technique reduces the stress at the interface between the source region 12 and the substrate 10, suppressing therefore the unwanted current, the double diffusion source makes it difficult to decrease the size of flash memory cells.

Accordingly, there is a need for an improved flash memory with a low resistivity path during an erase operation, and no snap-backs during the programming operation. There is a further need for an improved flash memory with a reduced width for the source side depletion region that prevents extra source depletion during erase operations.

SUMMARY OF THE INVENTION

The present invention provides a method of forming a self-aligned boron implanted pocket located underneath and around the source line junction for use in flash memory and other charge storage technologies. In one exemplary embodiment of the invention, the boron implanted pocket is formed after a self-aligned source etch and a self-aligned source implant is carried out, so that the configuration of the implanted boron follows the source junction profile. In another exemplary embodiment of the invention, the source implantation is carried out after the formation of the self-aligned boron implanted pocket, while the boron pocket implant is carried out after the self-aligned source etch.

These and other features and advantages will be more clearly understood from the following detailed description of the invention which is provided in connection with the accompanying drawings.

DETAILED DESCRIPTION OF THE PREFERRED EMBODIMENTS

In the following detailed description, reference is made to various specific exemplary embodiments in which the invention may be practiced. These embodiments are described with sufficient detail to enable those skilled in the art to practice the invention, and it is to be understood that other embodiments may be employed, and that structural, logical, and electrical changes may be made.

The terms "wafer" or "substrate" used in the following description may include any semiconductor-based structure that has an exposed semiconductor surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide.

The present invention provides a method of forming a self-aligned boron implanted pocket located underneath and around the source line junction for use in flash and other charge storage technologies.

Figure 1:
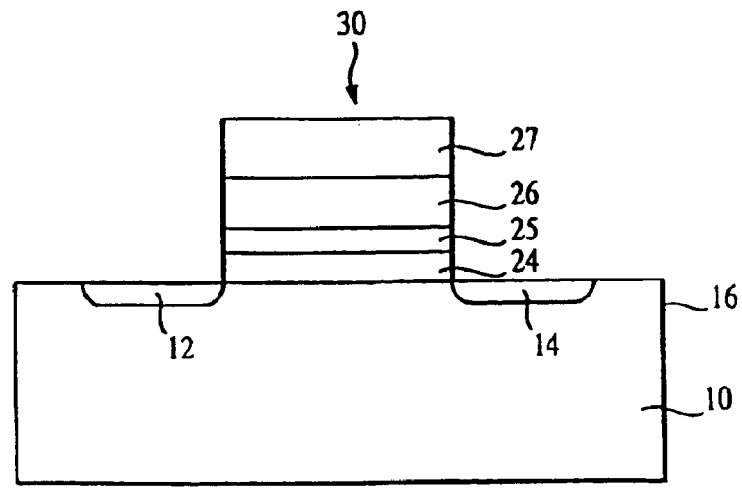
FIG. 1 illustrates a diagrammatic cross-sectional view of a conventional flash memory cell.
Figure 2:
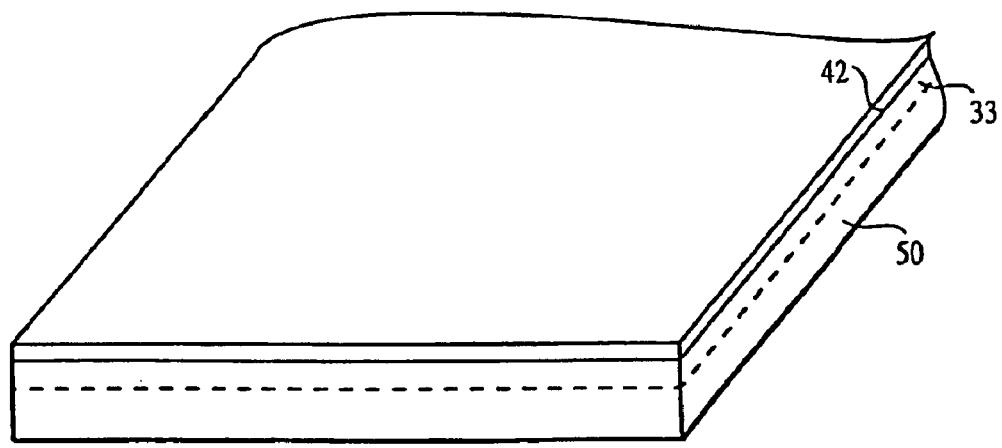
FIG. 2 illustrates a partial top view of a semiconductor topography, at an intermediate stage of processing, wherein a flash memory cell will be constructed in accordance with the present invention.
Figure 3:
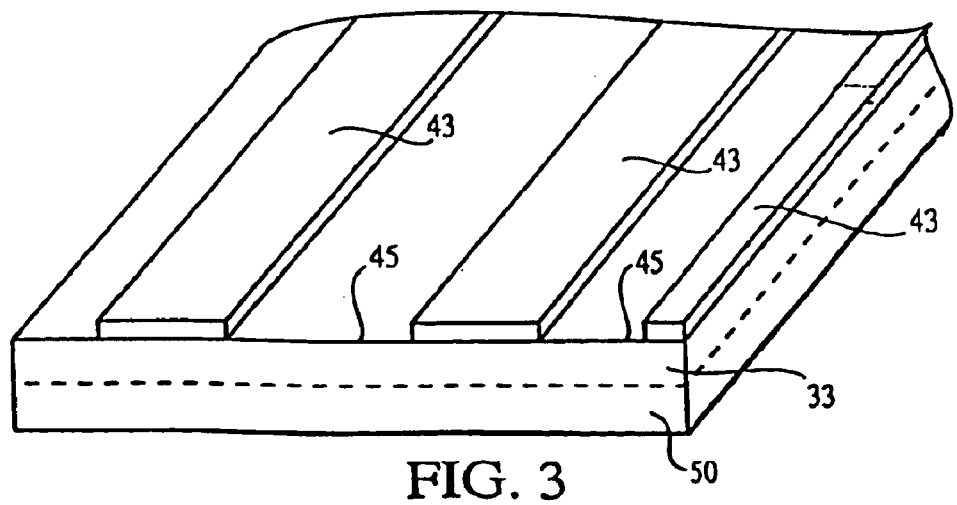
FIG. 3 illustrates a partial top view of the representative flash memory cell of FIG. 2 at a stage of processing subsequent to that shown in FIG. 2.

Referring now to the drawings, where like elements are designated by like reference numerals, FIG. 2 shows a partial top cross-sectional view of a flash memory array construction at an intermediate stage of processing. On a semiconductor substrate 50 having a doped well 33, a blanket sacrificial nitride layer 42 is formed by a low pressure chemical vapor deposition (LPCVD) process, for example, to a thickness of approximately 1,000 to 3,000 Å, preferably of about 1,500 Å. The sacrificial nitride layer 42 is then patterned and etched to form nitride regions 43 (FIG. 3), which protect portions of the semiconductor substrate 50 where drain and source active regions will be eventually formed leaving exposed regions 45 (FIG. 3) of the semiconductor substrate 50.

Figure 4:
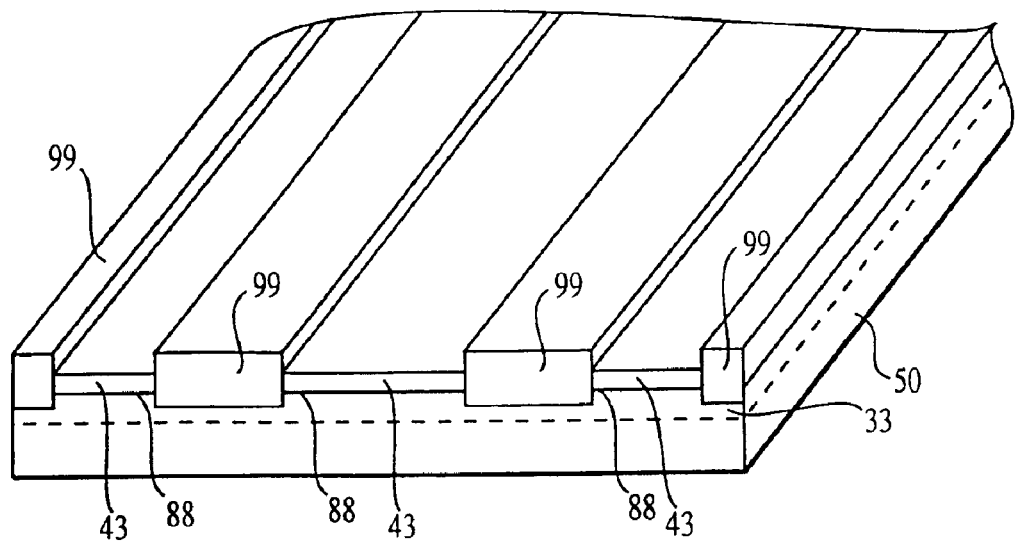
FIG. 4 illustrates a partial top view of the representative flash memory cell of FIG. 2 at a stage of processing subsequent to that shown in FIG. 3.
Figure 5:
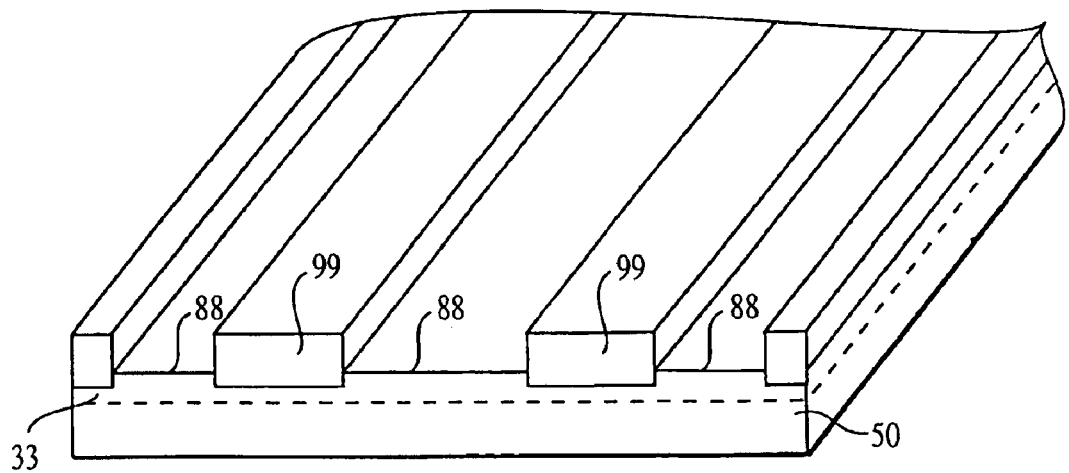
FIG. 5 illustrates a partial top view of the representative flash memory cell of FIG. 2 at a stage of processing subsequent to that shown in FIG. 4.

Referring now to FIG. 4, a high-temperature thermal oxidation step is performed so that field oxide regions 99 are formed on the exposed regions 45 of the semiconductor substrate 50. During the oxidation, the nitride regions 43 act as oxidation mask for active regions 88 (FIG. 5) where drain and source regions will be later formed as explained in more detail below.

Figure 6:
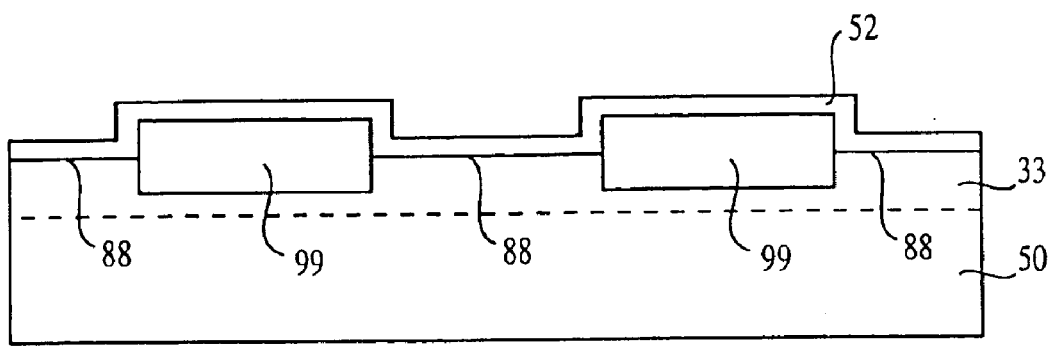
FIG. 6 illustrates a cross-sectional view of the representative flash memory cell of FIG. 5.

Nitride regions 43 are next removed (FIG. 5) and word lines 77 are next formed (FIGS. 8–16) as gate stacks in a direction perpendicular to the longitudinal direction of the active regions 88 and field oxide regions 99. For simplicity, the formation of the word lines 77 will be explained with reference to FIGS. 6–8, which represent only cross-sectional views of the semiconductor substrate 50 of FIG. 5.

To form the word lines 77, a gate dielectric layer 52 (FIG. 6) is first formed on the semiconductor substrate 50, including the active regions 88 as well as the upper surfaces of the field oxide regions 99. The thickness of the gate dielectric layer 52 is in the range of approximately 50 to 1,000 Å, preferably of about 100 Å, values that allow the gate dielectric layer 52 to function as a tunnel oxide in the subsequent flash memory device. The value of the dielectric constant of the gate dielectric layer 52 is in the range of approximately 3.8 to 4.2.

In an exemplary embodiment, the gate dielectric layer 52 may be formed by thermal oxidation, in which the semiconductor substrate 50 is disposed in a furnace chamber maintained at a temperature of approximately 800 to 1000° C. under an oxygen ambient. Alternatively, gate dielectric 52 may be formed by thermally growing oxynitride on the substrate 50 using a nitrogen and oxygen gas.

Figure 7:
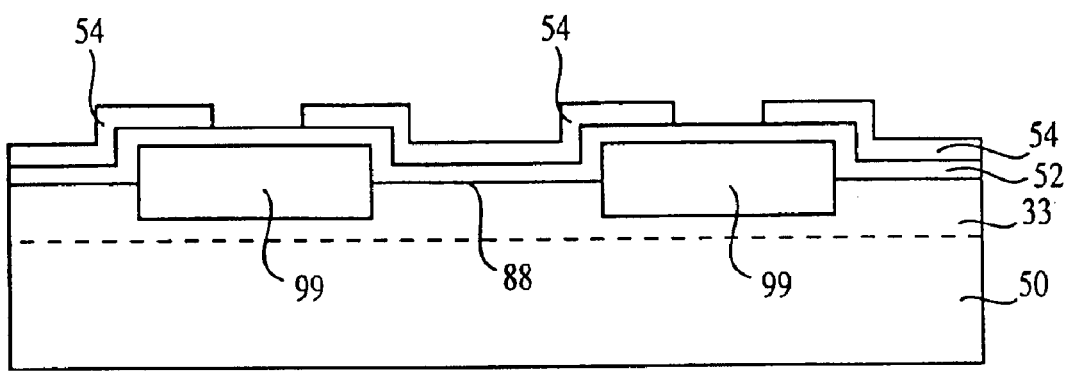
FIG. 7 illustrates a cross-sectional view of the representative flash memory cell of FIG. 5 at a stage of processing subsequent to that shown in FIG. 6.

Next, as shown in FIG. 7, a floating gate layer 54 formed of heavily doped polysilicon is deposited over gate dielectric layer 52. The preferred process for the formation of floating gate 54 includes the thermal decomposition of silane, in a CVD reactor chamber maintained at a temperature in the range of approximately 550 to 650° C. and at a pressure of less than approximately 2 Torrs. The thickness of the floating gate 54 is approximately 200 to 2,000 Å. Subsequent to the polysilicon deposition, the polysilicon layer is typically implanted with phosphorous, boron, or arsenic to lower the resistivity of the conductive polysilicon gate layer 54. Then, the floating gate layer 54 is patterned as in FIG. 7.

Figure 8:
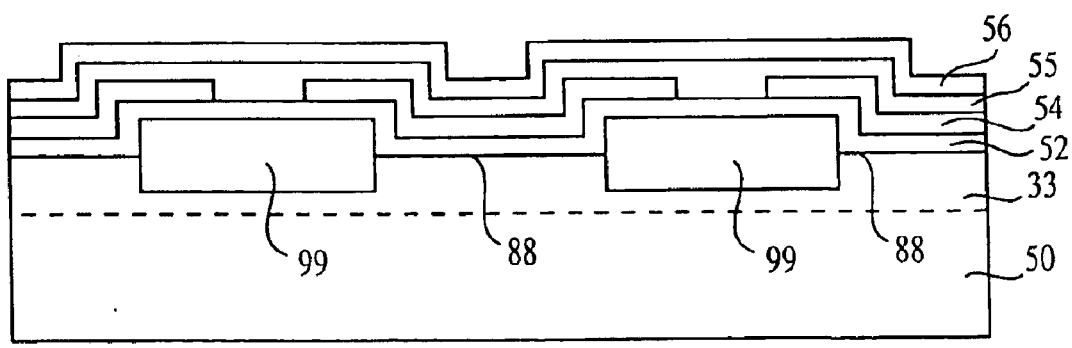
FIG. 8 illustrates a cross-sectional view of the representative flash memory cell of FIG. 5 at a stage of processing shown in FIG. 7.

Next, an inter poly dielectric (IPD) layer 55 formed of $SiO_2$—$SiN_4$—$SiO_2$ sandwich or aluminum oxide $Al_2O_3$ is deposited over the floating gate 54, as shown in FIG. 8.

Referring still to FIG. 8, a control gate layer 56 is formed over the inter poly dielectric layer 55 using CVD of polysilicon. The control gate polysilicon layer 56 is preferably deposited in a CVD reactor chamber maintained at a temperature of approximately 550 to 650° C. and at a pressure of less than 2 Torrs. The thickness of the control gate layer 56 is approximately 1,000 to 2,000 Å. Dopants such as phosphorous or boron may be implanted subsequently into the control gate layer 56 to increase its conductivity.

Figure 9:
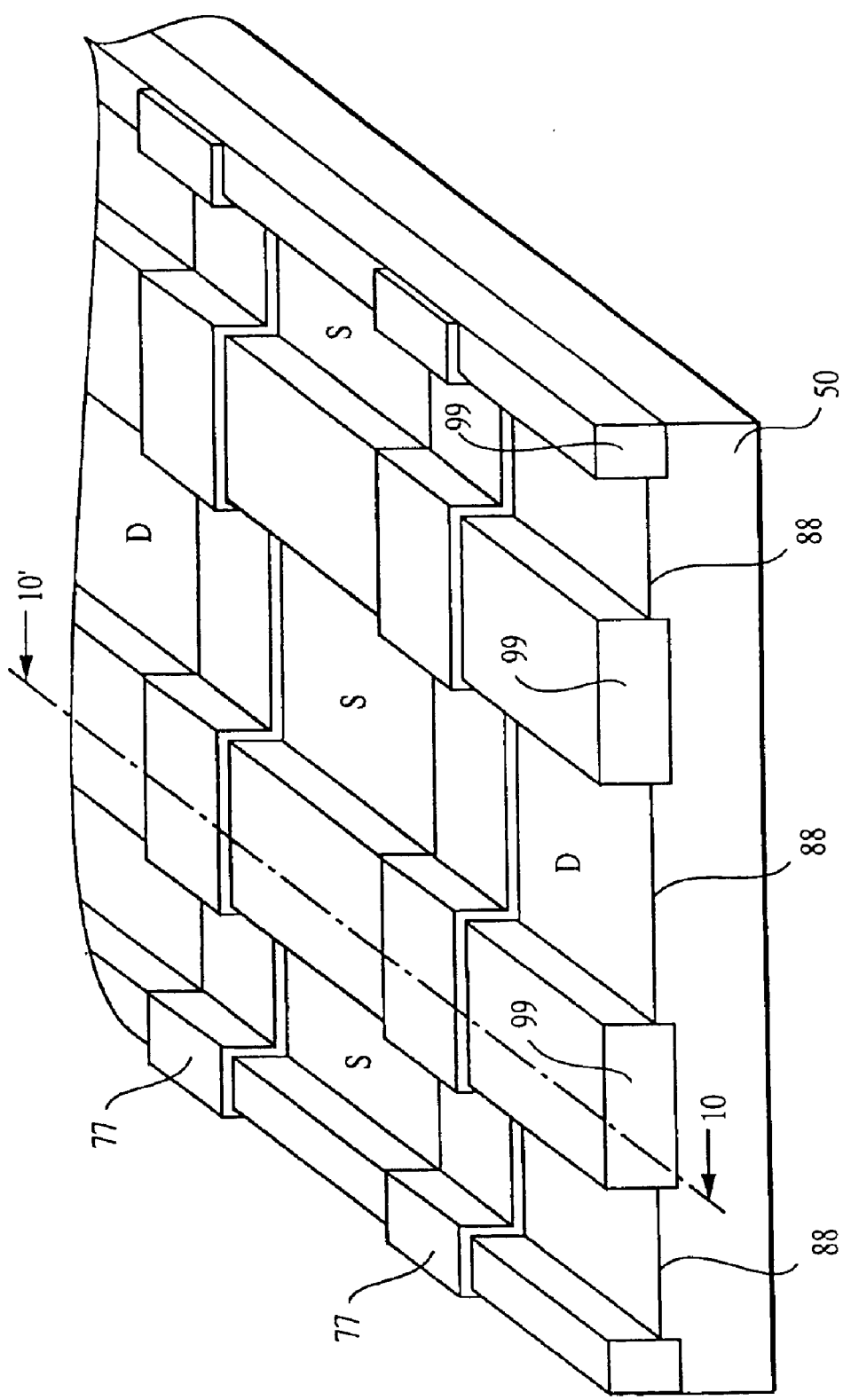
FIG. 9 illustrates a partial top view of the representative flash memory cell of FIG. 8.

Subsequent to the formation of control gate layer 56, conventional photolithography steps are performed so that the gate dielectric layer 52, floating gate layer 54, inter poly dielectric layer 55 and control gate layer 56 are patterned by masking the gate layers with photoresist and etching exposed portions of the gate layers to obtain word lines 77 as illustrated in FIG. 9.

Each of the two word lines 77 illustrated in FIG. 9 includes a gate dielectric 52, floating gate 54, inter poly dielectric 55 and control gate 56. FIG. 9 also shows a simplified top view of a flash memory array including a plurality of columns of active areas 88 where source and drain regions will be formed, perpendicularly intersecting a plurality of rows of word lines 77. As shown in FIG. 9, drain (D) and source (S) regions will be formed within the active areas 88 and in between the word lines 77. Field oxide regions 99 reside below the word lines 77 and around the active areas 88, thus chemically and physically isolating neighboring active areas.

Figure 10:
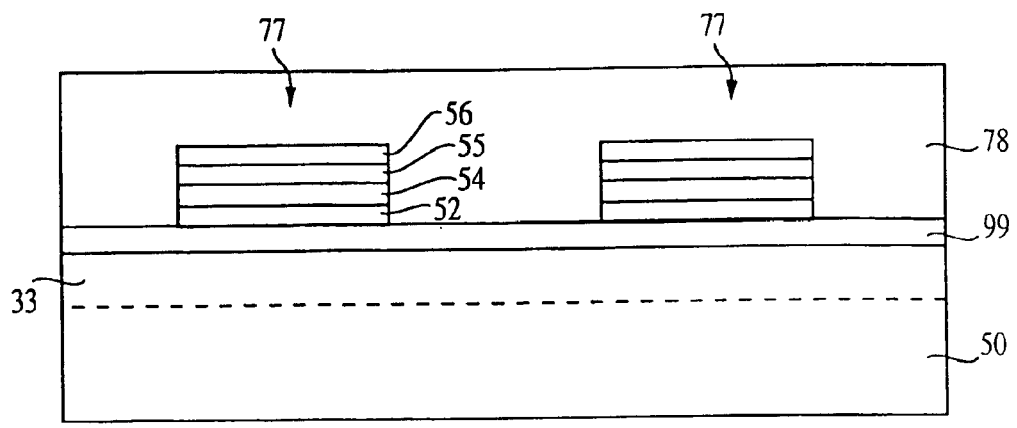
FIG. 10 illustrates a cross-sectional view of the representative flash memory cell of the FIG. 9 taken along line 10–10' at a stage of processing subsequent to that shown in FIG. 9.
Figure 11:
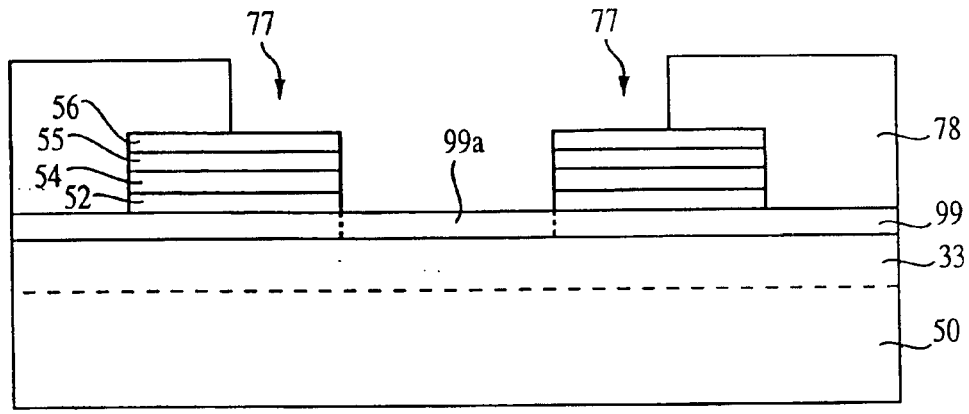
FIG. 11 illustrates a cross-sectional view of the representative flash memory cell of the FIG. 10 at a stage of processing subsequent to that shown in FIG. 10.

Reference is now made to FIG. 10, which illustrates a cross-sectional view of the flash memory cell array of FIG. 9, taken along line 10–10' and illustrating the two word lines 77 overlying the field oxide 99. A photoresist layer 78 is formed overlying the field oxide 99 and the word lines 77. The photoresist layer 78 of FIG. 10 is patterned by known photolithography methods to expose regions 99a of the field oxide 99 located in between adjacent word lines 77, as shown in FIG. 11.

Figure 12:
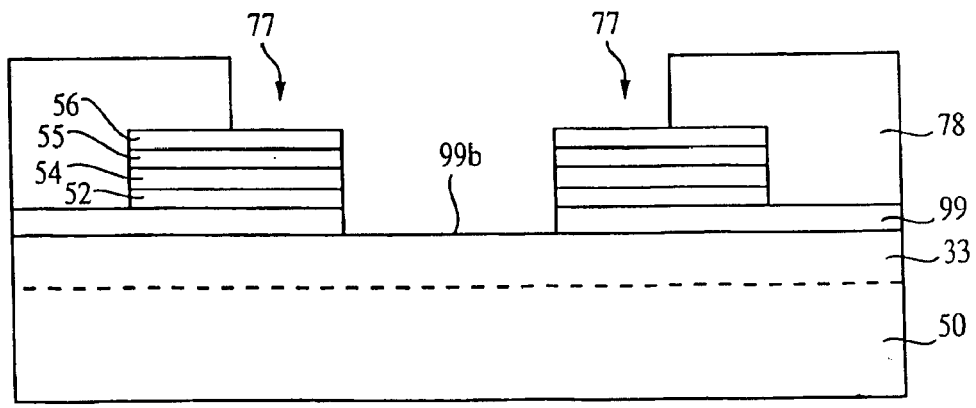
FIG. 12 illustrates a cross-sectional view of the representative flash memory cell of FIG. 10 at a stage of processing subsequent to that shown in FIG. 11.
Figure 13:
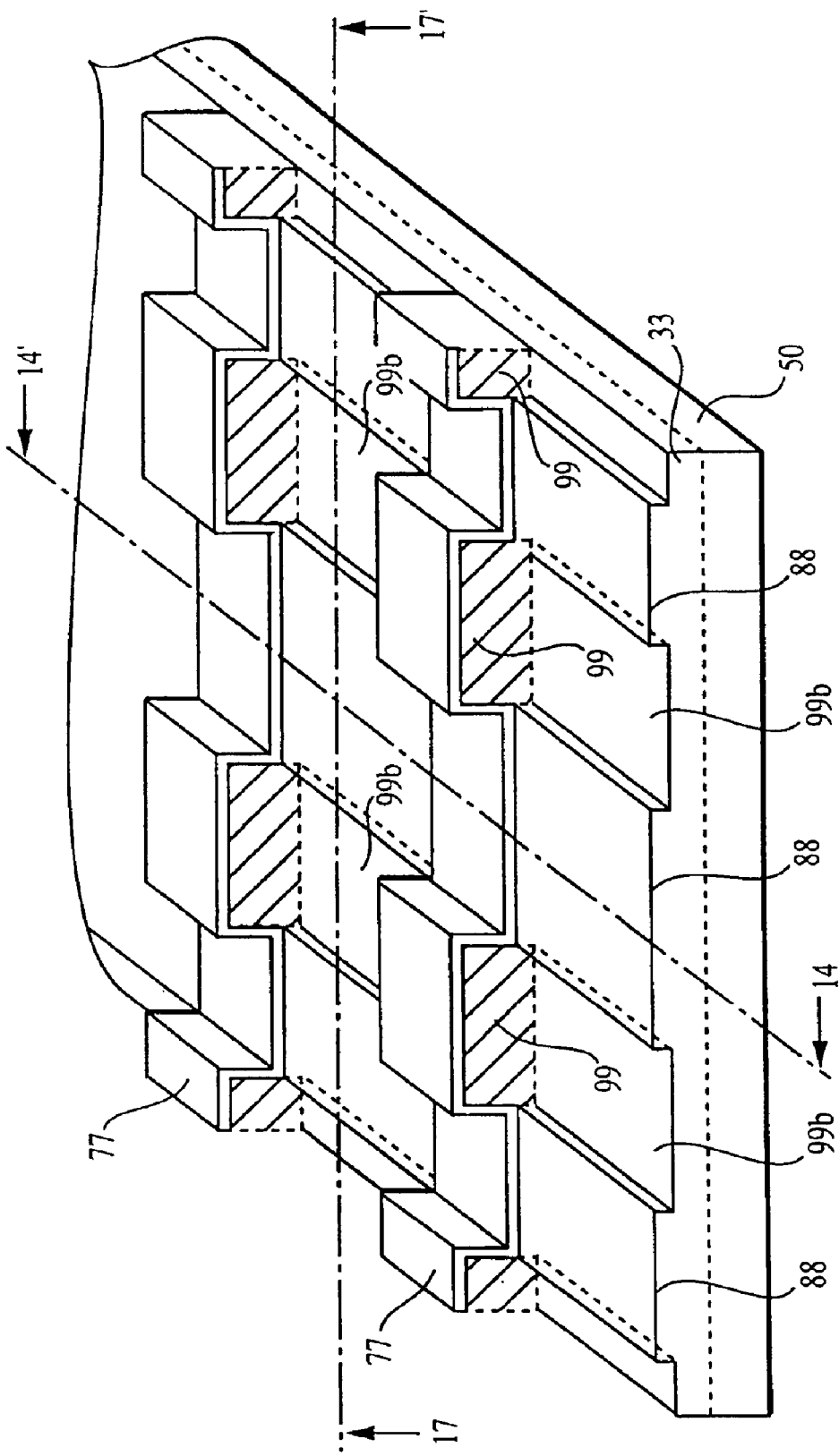
FIG. 13 illustrates a partial top view of the representative flash memory cell of FIG. 12.

Regions 99a of the field oxide 99 located in between the two adjacent word lines 77 are then etched to expose regions 99b of the substrate 50, as shown in FIG. 12. The surface of the substrate 50 at regions 99a is lower than the surface of the substrate 50 at the active regions 88 due to the removal of the oxide regions 99a. For a better understanding of the removal of the oxide regions 99a, reference is made to FIG. 13 which shows a top view of the semiconductor substrate 50, without the patterned photoresist layer 78, on which now exposed regions 99b between adjacent word lines of the substrate 50 are better illustrated. Removal of regions 99a from in between adjacent word lines 77 may be accomplished, for example, by selectively etching the oxide material of the field oxide 99 relative to the word lines 77 and the substrate 50 by any conventional etch chemistry.

Figure 14:
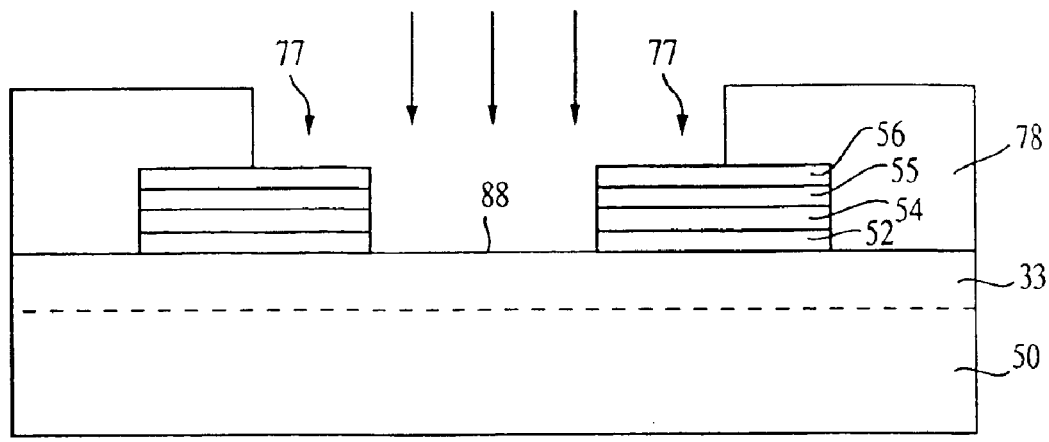
FIG. 14 illustrates a cross-sectional view of the representative flash memory cell of FIG. 13, taken along line 14–14' at a stage of processing subsequent to that shown in FIG. 13.
Figure 15:
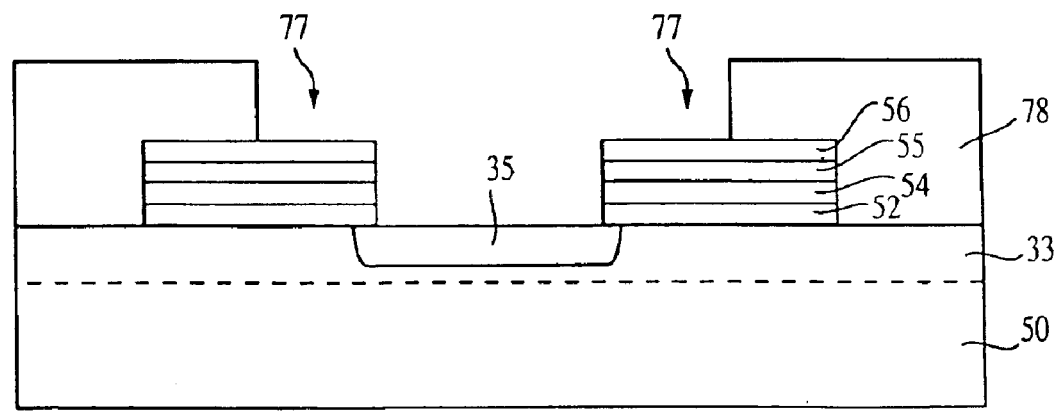
FIG. 15 illustrates a cross-sectional view of the representative flash memory cell of FIG. 14 at a stage of processing subsequent to that shown in FIG. 14.

Following the removal of the field oxide 99 from in between adjacent word lines, the photoresist 78 used for field oxide 99 etch can be used as a mask for a source region implantation. To better illustrate the formation of the source regions S, reference is made to FIG. 14, which is a cross-sectional view of the flash memory cell array of FIG. 13, taken along line 14–14' and showing a patterned photoresist layer 78 used to etch the field oxide 99. FIG. 14 illustrates the exposed active regions 88 which will undergo self-aligned source region implantation steps within the well 33 of the semiconductor substrate 50. The well 33 is typically doped to a predetermined conductivity, for example, p-type or n-type, depending on whether N-channel or P-channel flash will be formed therein. For N-channel flash, for example, n-type doped source region 35, doped with arsenic (As) or phosphorous (P), is formed in the p-type well 33 (FIG. 15).

Figure 16:
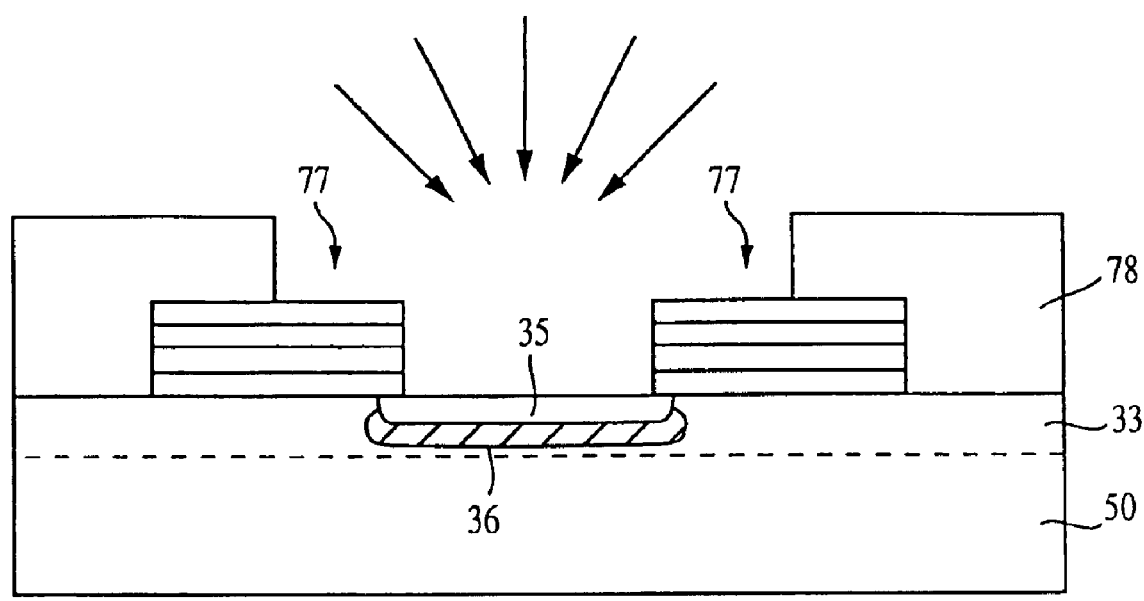
FIG. 16 illustrates a cross-sectional view of the representative flash memory cell of FIG. 14 at a stage of processing subsequent to that shown in FIG. 15.

Referring now to FIG. 16, subsequent to the source region 35 implantation step described above, a self-aligned boron implant is performed to create a self-aligned implanted boron pocket 36. The implantation energy for the boron implantation must be higher than the implantation energy of the previous source implant, so that the higher implantation energy will lead to a deeper boron pocket 36 formed below and/or around the source region 35.

Boron implantation may be achieved with an ion source. As known in the art, the amount of the boron implant, the concentration and its distribution profile can be controlled by varying the beam current, voltage and exposure time, as well as the incidence angle of the boron ions at the surface of the substrate 50. For example, boron ions can be implanted into 0.2 to 1.0 $\mu$m areas, at an energy of approximately 30 KeV and a dose of about $2\times10^{12}/cm^2$ to $1\times10^{14}/cm^2$, using a focussed ion beam implanter such as the one manufactured by Ion Beam Systems of Beverly, Mass., to form the self-aligned implanted boron pocket 36 shown in FIG. 16. This way, the boron implantation will follow the source junction profile.

Further, the boron implantation may be carried out at an incident perpendicular angle to the surface of the substrate 50. However, the boron implantation may be also carried out at incident angles that are not perpendicular to the plane of the substrate 50. Further, the boron implantation may be carried out at a 90 degree angle implant in addition to a tilt implant. By varying the incident angle at which the boron implantation is performed, the geometry of the self-aligned implanted boron pocket 36 is controlled more tightly.

Figure 17:
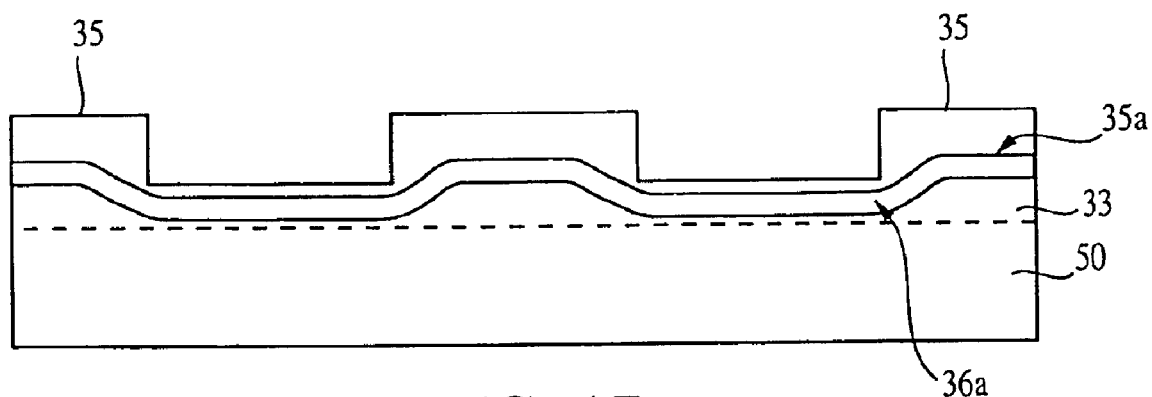
FIG. 17 illustrates the topography of the source junction and that of the self-aligned boron implanted pocket of the representative flash memory cell of FIG. 16.

The self-aligned implanted boron pocket 36 formed underneath and around the source junction follows the source junction profile, as shown in FIG. 17. FIG. 17 is a cross sectional view of the flash memory cell array of FIG. 13, taken along line 17–17' and after the formation of the self-aligned implanted boron pocket 36. As shown in FIG. 17, contour line 35a illustrates the profile of the doping of the source region 35 of FIG. 16. Contour line 36a, exemplifying the topography of the self-aligned implanted boron pocket 36 of FIG. 16, follows the contour line 35a, which is the source junction profile.

Although the invention has been described with reference to forming a source implant followed by a boron implant, the boron implant can be carried out first, followed by the source implant.

Following the formation of the self-aligned implanted boron pocket 36, further processing steps may be carried out in accordance with conventional IC fabrication processes to create a functional flash memory cell. For example, photoresist layer 78 is removed and another photoresist layer is applied and patterned to expose portions of the active regions 88 where drains are to be implanted and then a drain implant is conducted. Other processing steps may include formation of voltage conductors coupled to source and drain regions 35, 37 and other known processing steps to form flash memory cell and connect them to peripheral logical devices.

The charging of the floating gate 54 to program the cell 100 is achieved by grounding source and substrate regions 35 and 33, and applying a relatively high voltage to control gate 56 and a high voltage to drain region 37. Discharge of the floating gate 54 to erase the flash memory cell is achieved by grounding control gate 56, or biasing the control gate 56 with a negative voltage, floating drain region 37, and applying a relatively high voltage to source region 35.

Figure 18:
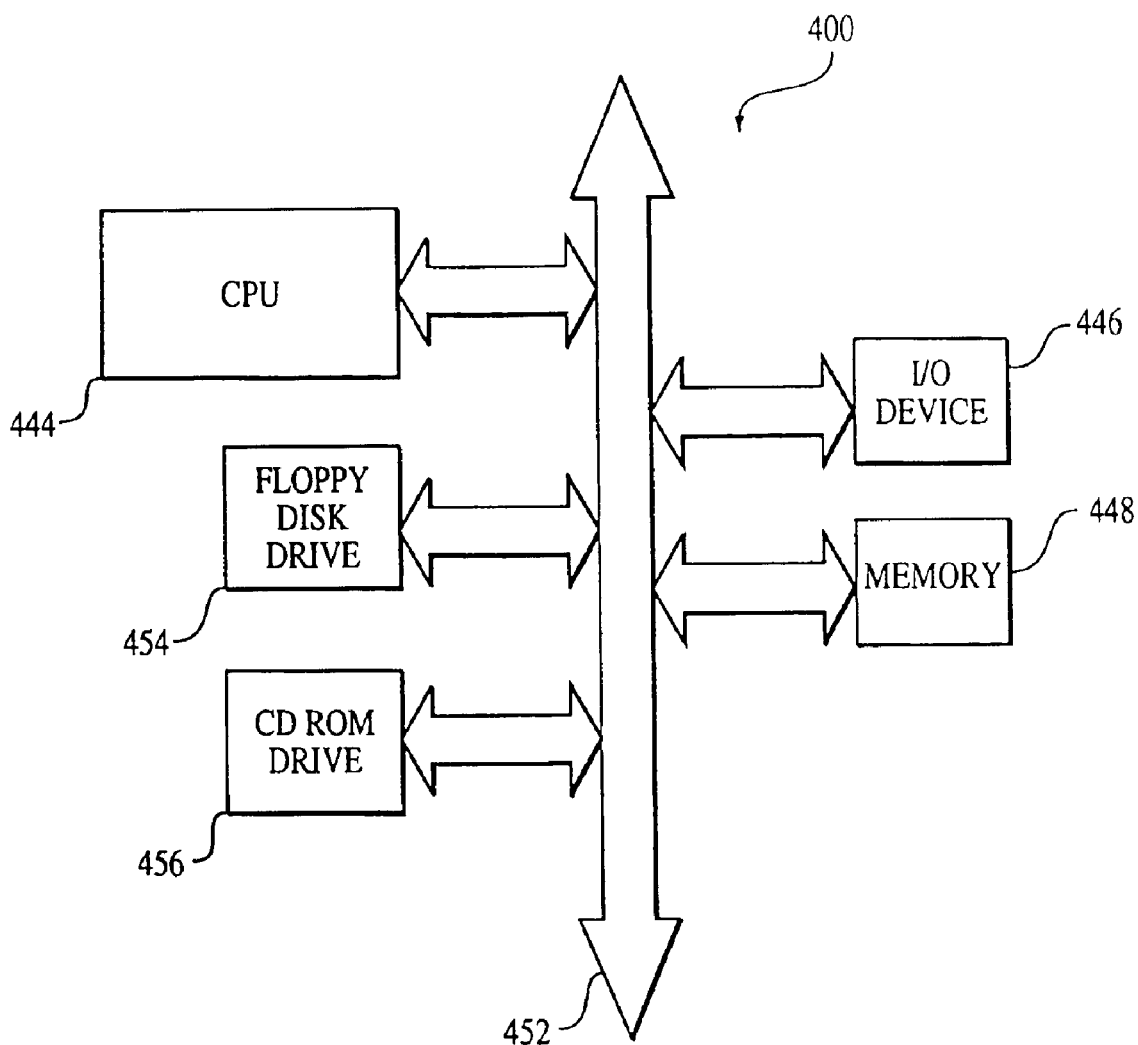
FIG. 18 is a schematic diagram of a processor system incorporating a flash memory cell of the present invention.

The resulting non-volatile memory cell 100 with the self-aligned implanted boron pocket 36 of the present invention may be utilized in a processor-based system. FIG. 18 illustrates a typical processor-based system 400 which includes a memory circuit 448, containing flash memory cells having self-aligned implanted boron pockets constructed in accordance with the present invention. A processor system 400, such as a computer system, generally comprises a central processing unit (CPU) 444, such as a microprocessor, a digital signal processor, or other programmable digital logic devices, which communicates with an input/output (I/O) device 446 over a bus 452.

In the case of a computer system, the processor system 400 may include peripheral devices such as a floppy disk drive 454 and a compact disk (CD) ROM drive 456, which also communicate with the CPU 444 over the bus 452. Memory 448 is preferably constructed as an integrated circuit, which includes flash memory cells having self-aligned implanted boron pockets in the same regions formed as previously described with respect to FIGS. 2–17. The memory 448 may be combined with the processor, for example CPU 444, in a single integrated circuit.

Although the exemplary embodiments described above refer to one self-aligned boron implanted pocket, it must be understood that the present invention contemplates the use of a plurality of self-aligned boron implanted pockets formed beneath source regions so that the configuration of the implanted boron follows the source junction profile. Further, although the exemplary embodiments described above refer to the formation of the self-aligned boron implanted pocket after the source implant is carried out, it must be understood that the invention also contemplates the formation of the boron implanted pockets before the source implantation, as long as the field oxide has been previously removed from in between adjacent word lines.

Although the embodiments described above refer to the formation of a pocket implanted with dopant atoms, such as boron, it must be understood that the invention is not limited to the use of boron and other p-type dopants may be used also, for example $BF_2$. Furthermore, p-type dopants, such as boron (B), may be used also if an n-well is formed in place of p-well 33 over the substrate 50, with of course, the doping of the relevant active area regions changing accordingly. In addition, although the embodiments described above refer to the formation of a region implanted with dopant atoms in the form of a pocket, it must be understood that the invention is not limited to the above configuration, and other geometries, such as a round shape, may be employed also, as long as the dopant implantation is carried out subsequent to the field oxide removal.

Accordingly, the above description and drawings are only to be considered of illustrative embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory device comprising:
   a floating gate formed over a semiconductor substrate between a source region and a drain region, said source region being of a first conductivity type;
   a control gate formed over said floating gate; and
   a self-aligned dopant implanted region located underneath and around said source region, said dopant implanted region being of a second conductivity type which is different from said first conductivity type, said self-aligned dopant implanted region having a configuration that follows the topography of said semiconductor substrate.

2. The memory device of claim 1, wherein said self-aligned dopant implanted region includes a p-type dopant.

3. The memory device of claim 2, wherein said p-type dopant is boron.

4. The memory device of claim 2, wherein said p-type dopant is $BF_2$.

5. The memory device of claim 1, wherein said self-aligned source implanted region has a configuration that follows that of said source region.

6. The memory device of claim 1, wherein said memory device is a flash memory device.

7. The memory device of claim 1, wherein said self-aligned dopant implanted region includes an n-type dopant.

8. A memory structure comprising:
   a substrate;
   a plurality of spaced field oxide regions provided over said substrate, said spaced field oxide regions extending in a first direction and being segmented at predetermined regions over said substrate;
   a plurality of spaced gate stacks extending over said field oxide regions and substrate in a second direction substantially perpendicular to said first direction;
   predetermined pairs of adjacent spaced gate stacks having a source region between them extending in said second direction, said predetermined regions residing between said predetermined pairs of adjacent gate stacks, and said source region extending along said predetermined regions; and
   a self-aligned implanted region beneath and extending along both said source region and said predetermined regions.

9. The memory structure of claim 8, wherein said implanted region is a boron implanted region.

10. The memory structure of claim 8, wherein said implanted region forms a pocket for said source region.

11. The memory structure of claim 8, wherein said predetermined regions of said substrate are at a lower substrate surface elevation than other regions of said substrate.

12. The memory structure of claim 11, wherein said source region has a doping profile which follows variations in substrate surface elevation in said second direction.

13. The memory structure of claim 12, wherein said implanted region has a doping profile which follows a doping profile of said source region in said second direction.

14. The memory structure of claim 8, further comprising drain regions located on opposite sides of each of said gate stacks of said predetermined pairs from said source region, said drain regions having portions of said field oxide regions on opposite sides thereof in said second direction.

15. The memory structure of claim 14, wherein said gate stacks, source region and drain regions form a plurality of transistors.

16. The memory structure of claim 15, wherein said transistors are flash memory transistors.

17. The memory structure of claim 8, further comprising a processor coupled to said memory structure.

* * * * *